United States Patent [19]

Desai et al.

[11] Patent Number: 5,656,554

[45] Date of Patent: Aug. 12, 1997

[54] SEMICONDUCTOR CHIP RECLAMATION TECHNIQUE INVOLVING MULTIPLE PLANARIZATION PROCESSES

[75] Inventors: Mukesh Desai, Phoenix, Ariz.; Mun Sok Pak, Hopewell Junction, N.Y.

[73] Assignee: International Business Machines Corporation, Armonk, N.Y.

[21] Appl. No.: 282,679

[22] Filed: Jul. 29, 1994

[51] Int. Cl.$^6$ .................................................. H01L 21/465
[52] U.S. Cl. ......................... 438/691; 438/697; 438/692; 438/4
[58] Field of Search ...................... 156/625.1, 656.1, 156/636.1, 651.1; 437/228, 245, 246

[56] References Cited

U.S. PATENT DOCUMENTS

| | | | |
|---|---|---|---|
| 4,062,102 | 12/1977 | Lawrence et al. | 29/572 |
| 4,255,229 | 3/1981 | Morcom | 156/628 |
| 4,551,629 | 11/1985 | Carson et al. | 250/578 |
| 4,891,325 | 1/1990 | Hezel et al. | 437/2 |
| 4,892,612 | 1/1990 | Huff | 156/636 |
| 4,980,019 | 12/1990 | Baerg et al. | 156/643 |
| 5,069,747 | 12/1991 | Cathey et al. | 156/643 |
| 5,142,828 | 9/1992 | Curry, II | 51/281 R |

OTHER PUBLICATIONS

Semiconductor International, May, 1993, CMP Takes a Global View, Ron Iscoff, West Coast Editor, pp. 72–78.

Research Disclosure, May, 1990, No. 313, Low Temperature Planarized Pre–Metal Passivation.

R. Iscoff, "CMP Takes A Global View" Semiconductor International, May, 1993, pp. 72–74, 76,78.

S.L. Pennington, "Low Temperature Planarized Pre–Metal Passivation", Research Disclosure, May, 1990, No. 313, (1 page).

Primary Examiner—John S. Chu
Attorney, Agent, or Firm—Charles W. Peterson, Jr.

[57] ABSTRACT

A method for removing conductive metals on a semiconductor chip while leaving a foundation on which the conductive metal is in contact with substantially intact. The foundation includes a dielectric layer and a connecting stud. The dielectric layer is formed from a material which has a relatively high reactivity to an attack by a base, but has a relatively low reactivity to an attack by acid. A first planarization process is applied to the semiconductor chip, the first planarization process attacks the conductive metal at a high rate and is discontinued prior to when the connecting stud via is exposed to direct effects of the first planarization process. A second planarization process is applied to the semiconductor chip. The second planarization process attacks the conductive metal at a relatively high rate, but attacks the connecting stud at a low rate. The second planarization process substantially removes what is left of the conductive metal after the first planarization process. A sacrificial material is deposited over the semiconductor chip, the sacrificial material has an etch rate equal to, or higher than, the etch rate of the inter-level dielectric base.

21 Claims, 2 Drawing Sheets

SEMICONDUCTOR CHIP RECLAMATION TECHNIQUE INVOLVING MULTIPLE PLANARIZATION PROCESSES

FIELD OF THE INVENTION

The present invention relates to reclaiming (removing some of the conductive metal material associated with) a semiconductor chip which has some error associated with its layout, and more particularly to a multiple step technique which removes the metal conductor layer while keeping a connecting stud, and a dielectric base of the semiconductor chip, in substantially its original condition.

BACKGROUND OF THE INVENTION

The typical technique to manufacture semiconductor chips involves layering a first layer metallic pattern on top of a first layer dielectric base. As soon as the first layer metallic pattern is tested for proper electrical conductivity characteristics, a second layer dielectric base is formed on top of the first layer dielectric base and metallic pattern. A second layer metallic pattern is thereupon layered on top of the second layer dielectric base, and the electrical characteristics of the second layer metallic pattern is then tested. This process is continued for each of the subsequent layers of dielectric base and metallic pattern. At different stages during the semiconductor chip manufacturing process, a connecting stud (also known as an electric via) extends through one or more layers in such a manner that an electrically conductive connection is formed between the metallic patterns of different layers of the semiconductor chip.

Electronic testing of each layer of the metallic pattern (which forms the electrically conductive pathways) becomes more involved as the electronic chips become more sophisticated. Once a subsequent layer of dielectric base is layered on top of a specific layer of metallic pattern, the only technique by which the metallic pattern can be modified is to remove each subsequent layer(s) of metallic patterns and dielectric base (all the work associated with the subsequent layers is wasted.) For this reason, it is important to be certain that each layer of metallic pattern is functioning properly before the next layer of dielectric base is laid down.

If the electrical and/or optical characteristics of the metallic layer which is being tested are faulty or questionable, it may be desired to remove all or part of the metallic pattern in the metallic layer being tested, and to replace the removed metallic layer with another metallic layer which is functioning properly. The process of removing the faulty metallic pattern and replacing it with a new layer of metallic pattern is known in the art as "re-working" the metallic layer. The process of removing an entire metal layer, or a portion of a metal layer is known as "reclamation". These terms are used throughout this disclosure.

During re-working or reclamation of the metallic layer, it is desirable to completely remove the metallic layer while removing or distorting very little of the original dielectric base and any connecting studs which are presently in place. Distorted dielectric bases can result in a difficulty in forming the next metallic layer. Additionally, electronic requirements specify the proper dimensioning of each layer of dielectric base, metallic layer, and the proper size and shapes of the connecting studs. Therefore, if the reworking or the reclamation process removes too much of the dielectric base or the connecting stud, then the defective portion will have to be replaced, (and perhaps the entire electronic chip will have to be scrapped).

Present techniques to reclaim or rework metallic layers include utilizing an acid planarization process to remove the metallic layers. These techniques typically work adequately if there is only a single re-work process or reclaiming being performed on top of each dielectric base layer, since an allowable amount of dielectric will be removed in a single process. However, as the electronic circuitry becomes more complex; the dimensions of the metallic conductor lines become smaller; the overall dimensions of the circuitry associated with each metallic layer increases; and/or the possibility for mistakes for each layer of electronic layer increases. Thus, the probability for multiple re-works also increases. It therefore becomes desirable to provide some technique which would permit more than a single rework to any metallic layer.

From the above, it can be envisioned that providing some reclamation or re-work technique which does not remove or distort excessive amounts of dielectric layer material, or connecting stud material, would be highly desirable. This technique becomes more significant, in general, as the semi-conductor chips become more complex, and the necessity for multiple re-working or reclamation processes increases on top of a single dielectric layer.

SUMMARY OF THE INVENTION

The foregoing and other problems are overcome by a technique which removes electrically conductive metals on a semiconductor chip while leaving substantially intact a foundation on which the conductive metal is in contact with. The foundation includes a dielectrical layer and optionally one or more connecting studs. One or more planarization processes may be applied to the semiconductor chip. In a preferred embodiment, a first planarization process is applied to the semiconductor chip, the first planarization process attacks the conductive metal at a high rate and is discontinued prior to when a connecting stud via is exposed to direct effects of the first planarization process. A second planarization process is applied to the semiconductor chip. The second planarization process attacks the conductive metal at a relatively high rate, but attacks the connecting stud at a low rate. The second planarization process substantially removes what is left of the conductive metal after the first planarization process is performed.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1A:
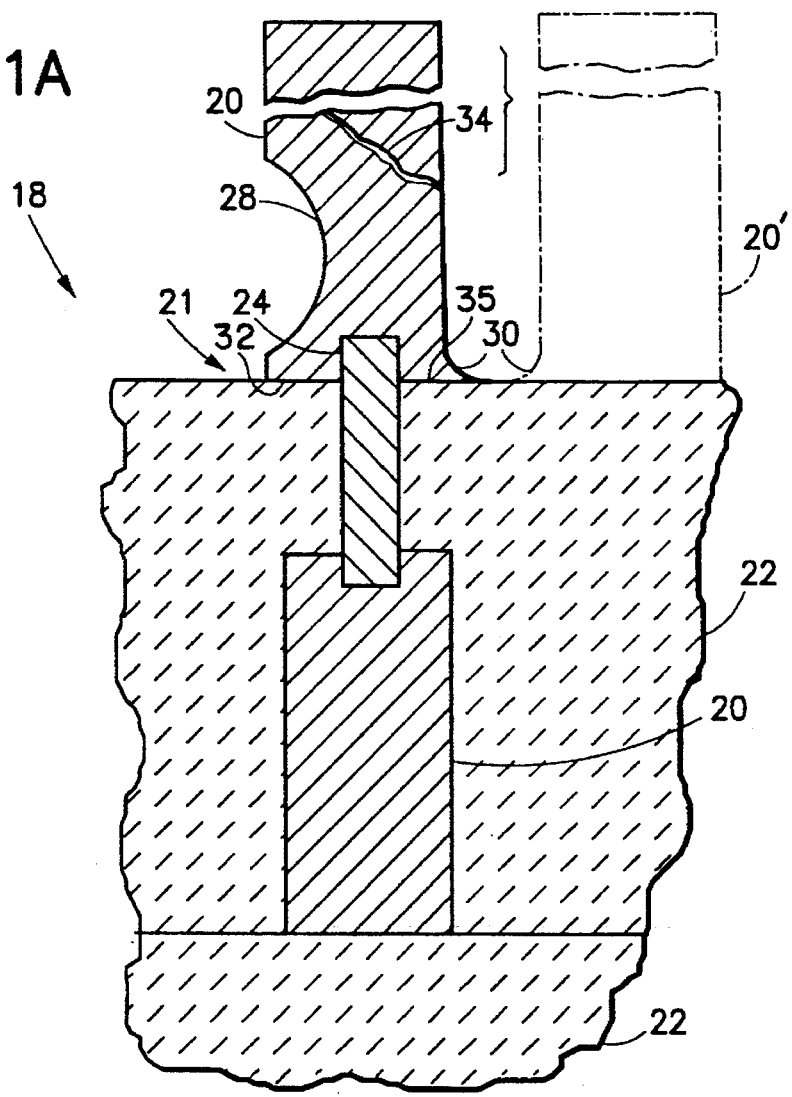
FIG. 1A is a cross sectional view of a portion of a semiconductor chip having multiple dielectric layers associated with multiple metallic layers, a connecting stud connects the metallic layers, the upper metallic layer has a plurality of faults.

In this disclosure, elements which perform similar functions in different embodiments may be provided with identical reference characters. While a preferred embodiment is illustrated in this patent application, it is intended that the scope of the claims, as interpreted by one having ordinary skill in the art, define the scope of the present invention; and therefore that the embodiment illustrated in FIGS. 1A–1D does not unduly limit the scope of the present invention.

FIG. 1A illustrates segments associated with a semiconductor chip 18. While the term "semiconductor chip" is used in this patent application, this term is defined as any structure which when finally constructed, has one or more metallic layers 20, with each metallic layer being located between two distinct dielectric layers. The upper metallic layer 20 in FIG. 1A is presumed to have some electrical and/or visual defect which necessitates a re-work or a reclamation process.

FIGS. 1A to 1D illustrate a progression associated with one embodiment of the present invention which permits removal of the uppermost, exposed metallic layer 20 (which is typically an aluminum alloy), without adversely affecting the material of a foundation 21. The foundation includes a dielectric layer 22 and an embedded connecting stud 24. There are several faults indicated in the upper metallic layer 20 of FIG. 1A. The first fault is by a notch 28. Notches can vary considerably in dimensions and may account for a loss of a majority of the desired material, in certain regions, of the metallic layer. Notches typically reduce the conductivity of the metallic layer by limiting the cross-sectional area where electrical current is permitted to flow. The second fault illustrated in FIG. 1A is a foot 30 which is formed at an intersection 32 of the metallic layer 20 and the dielectric layer 22. An intersection 35 is illustrated which contains the foot 30. The major problem with the inclusion of the foot or feet 30 occurs when there are two feet 30 which are formed on neighboring metallic layers 20 (a neighboring metallic layer is illustrated in phantom in FIG. 1A at 20'.) When there are two neighboring feet 30 in adjacent metallic layers 20, 20' which are positioned too close to each other, then there can be shorting between the metallic layers 20, 20'.

The third fault illustrated in FIG. 1A is a crack 34 formed in the metallic layer 20 itself. Cracks 34 can lead to a decrease in the conductivity of the metallic layer 20. The above three faults indicate the types of fault which are being tested for when each of the metallic layers 20 of the semiconductor chip is undergoing testing. These three faults are intended to be illustrative of the type of faults which may be tested for, but are by no means a complete list of the faults which may be tested for (testing processes also typically test for opens, shorts, or conductors with extremely high resistances.) Other examples of faults include processing errors, contamination of the metal in the metallic layer 20, scratches, opens, etc. It is also emphasized that effects of each of the above three faults may be contributory to a general reduction in conductivity, or undesired conductivities. For example, while the notch 28 illustrated in FIG. 1A may not be large enough to limit conductivity to such a point as to require a re-work, the notch in combination with the crack 34, or another notch, may well be.

The FIGS. 1A–1D embodiment illustrates a technique involving two planarization processes performed, in succession, to remove the material of the metallic layer 20 while leaving the original foundation substantially intact. Each planarization process is also capable of removing other material in the semiconductor chip 18. Therefore, the materials selected, and the total times that each of the planarization processes are performed becomes important.

Figure 1B:
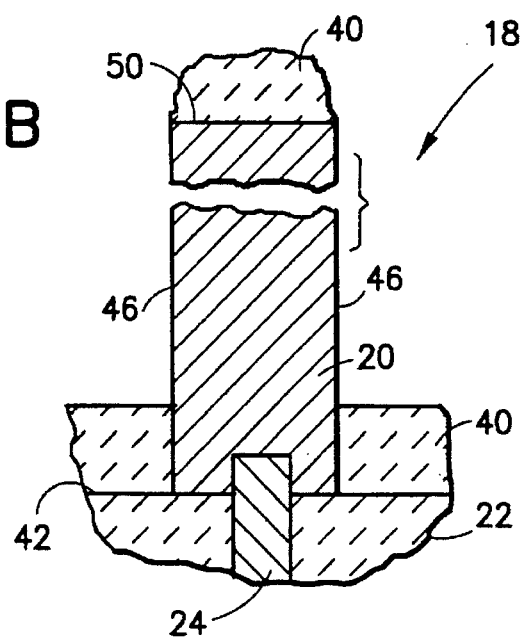
FIG. 1B is a portion of the semiconductor chip of FIG. 1A, with a layer of sacrificial material applied on top of the semiconductor chip.

Since there may be more than one successive re-work process applied to the semiconductor chip 18, FIG. 1B illustrates the application of a layer of sacrificial layer 40 to an upper surface 42 of the foundation 21. The sacrificial layer is preferably formed from a similar material as the dielectric layer 22, and is configured such that the planarization processes will remove material from the sacrificial layer 40 instead of the dielectric layer 22. To provide some indication of scale, the sacrificial layer 40 is typically 3,000 Angstroms thick when the metallic layer 20 is 10,000 to 15,000 Angstroms thick. The sacrificial layer may be formed from a wide variety of materials such as silicon dioxide from, for example, chemical vapor deposition; photoresist; polyimide; etc. The desirable characteristics of the sacrificial layer 40 include a relatively low removal rate for the first planarization process, and a relatively high removal rate for the second planarization process. The sacrificial layer 40 covers upper surfaces of the dielectric layer 22 as well as the metallic layer 20, even though the function of the sacrificial layer 40 is related primarily only to protecting the dielectric layer 22 and not the metallic layer 20.

There are different types of planarization processes which may be utilized in the present invention. The first planarization process is an acid planarization process, in which materials which are highly reactive to acid attack (which are directly exposed to the first planarization process) are removed at a higher rate than materials which are less reactive to acid attack. The second planarization process, which occurs subsequent to the first planarization process in the present invention, is a base planarization process. The second planarization process involves application of bases (for example, alkalis) to the upper surface 42 of the semiconductor chip 18, to remove materials which are highly reactive to attack from bases and at a faster rate than materials which are less reactive to bases. It is generally known what the rate of removal of each of the materials are when they are attacked from each of the first and second planarization processes. Therefore, it can also be determined how much time each of the planarization processes is to be applied, as well as how thick to make the sacrificial layer.

There are several different types of planarization processes which may be utilized for each of the first and the second planarization process. These planarization processes include, but are not limited to, chemical-mechanical polishing techniques, plasma etch techniques, and wet etch techniques. Each of these planarization processes is generally well known in the art and will not be further detailed herein.

Figure 1C:
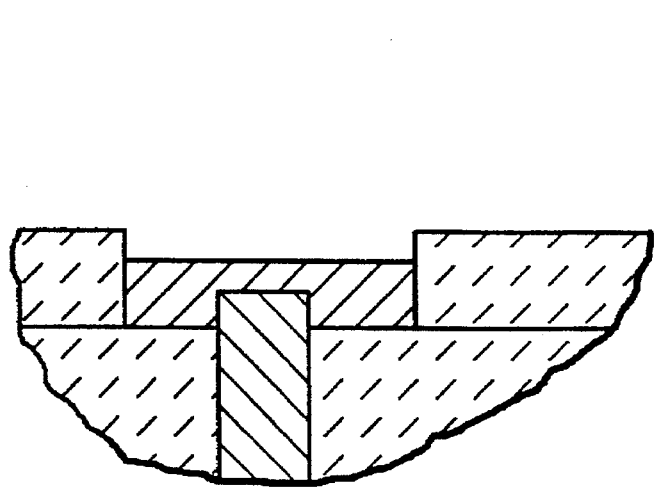
FIG. 1C is the semiconductor chip of FIG. 1B, with the metallic layer largely removed by an acid planarization process.

FIG. 1C illustrates the semiconductor chip 18 after an application of the first (acid) planarization process. The metallic layer 20 is highly reactive to the acid planarization process, and this process accounts for the majority of the removal of the metallic layer 20. The sacrificial layer 40 is also reactive to attack by the acid planarization process. The sacrificial layer 40, which when applied covers an upper surface 50 of the metallic layer as illustrated in FIG. 1B, does not protect the metallic layer 20 because the application of the acid planarization process attacks the sides 46 of the metallic layer 20 (the sides 46 of the metallic layer are not covered by the sacrificial layer 40). Even though the sacrificial layer 40 is attacked by both the first planarization process and the second planarization process, the rate at which the material of the sacrificial layer 40 is removed by both of the planarization processes is relatively slow compared to the rate at which the metallic layer 20 is removed. It is desired that after the second planarization process is complete, all, or almost all, of the Sacrificial layer will be removed. The sacrificial layer 40 will cover and protect the dielectric layer 22 during both the first and the second planarization processes. After the second planarization process is complete substantially all of the original dielectric layer 22 will be intact. For this reason, multiple successive re-works can be performed on any one layer of metallic layer 20 of the semiconductor chip 18 without removing any of the original dielectric layer.

The first planarization process is continued until the amount of the metallic layer 20 which remains barely covers the connecting stud 24. The connecting stud is typically formed of a tungsten alloy, and as such is highly reactive to attack from the first (acid) planarization process. However, the connecting stud does not react strongly to the application of the second (base) planarization process. Therefore, it is important to time the duration of the first planarization process such that the connecting stud 24 will be covered during the entire process.

It is necessary to apply the sacrificial layer 40, during each re-work or reclamation process, if there will be multiple re-works (providing that the dielectric layer 22 is susceptible to attack from either the first or the second planarization process) in order to maintain the height of the dielectric layer during each re-work. However, in those instances where there are going to be only a very few re-work or reclamation processes (providing that this limited number of re-works itself will not remove excessive material from the dielectric layer), then there is no need to apply the sacrificial layer 40 of FIG. 1B at all to the semiconductor chip. When there is no sacrificial layer 40 applied, then the amount of dielectric material which is lost during each of the planarization processes must be computed from the dielectric layer 22 itself.

Figure 1D:
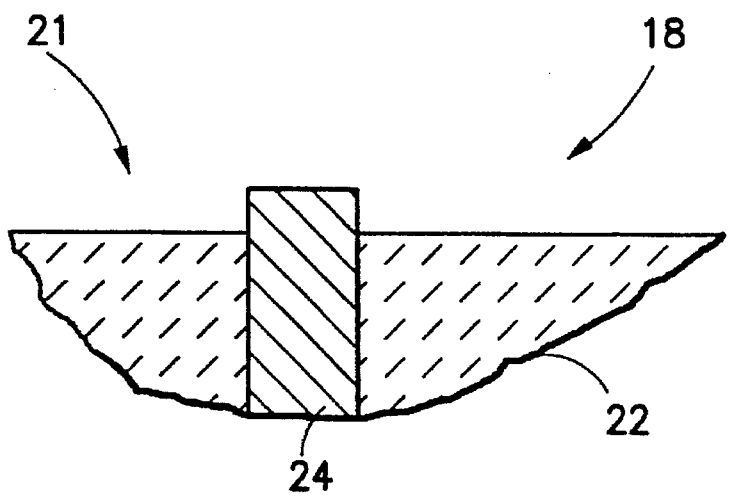
FIG. 1D is the semiconductor chip of FIG. 1C, with the metallic layer and the sacrificial material which was applied in FIG. 1B entirely removed by a basic planarization process.

FIG. 1D illustrates the semiconductor chip 18 after the application of the second planarization process. The second planarization process involves the application of a base, to the upper surface of the semiconductor chip 18. The base is typically an alkali, even though it may be of any type of base. During the second planarization process, the remainder of the sacrificial layer 40 which was not etched away during the first planarization process is consumed. It is important to precisely control the thickness of the sacrificial layer, and/or the time of application of the first and second planarization processes such that most of the sacrificial layer is consumed. The sacrificial layer 40 once again limits the application of the base to the original dielectric layer 22, whereby very little of the dielectric layer 22 is eroded during both the first and second planarization processes. The sacrificial layer 40 limits gross erosion to the dielectric layer 22 which would reduce the thickness thereof, potentially bringing the semiconductor chip, out of permissible dimension limits after one or more re-works.

The second (base) planarization process also attacks the metallic layer 20, even though usually not as aggressively as the first planarization process. The second planarization process should be applied for a sufficiently long period as to remove substantially all of the metallic layer 20. The second planarization process will not substantially attack the connecting stud 24 which, as noted above, is preferably formed from a tungsten alloy. In effect, the connecting stud is never directly exposed to any planarization process which could damage it, since the first planarization process is the only one which has the chemical capability of significantly attacking the connecting stud, and the first planarization process is terminated prior to the connecting stud being exposed from beneath its covering of the metallic layer. The connecting stud 24 extends above the dielectric layer 22, to provide a more robust electrical contact between the connecting stud and the associated metallic layer.

Using the above techniques as described between FIGS. 1A and 1D, all, or nearly all, of the metallic layer 20 is removed, while limiting any damage or gross material being removed from either the connecting stud 24 or the dielectric layer 22. This technique permits multiple reworks on the same dielectric layer of the semiconductor chip 18 without producing excessive damage thereto.

It should be emphasized that while the above described present invention is largely concerned with the chemical interrelation of the connecting stud, the sacrificial layer, and the metallic layer, it is also within the scope of the present invention to perform the above described process using a sacrificial layer even when there is no connecting stud in the layout. Under these circumstances, the purpose of the sacrificial layer 40 is simply to protect the dielectric layer.

Manufacturing Techniques

While the above section provides an overview of reworking or reclaiming a metallic layer in a semiconductor chip, the following provides some manufacturing considerations relating to the materials, temperatures, and techniques of a preferred embodiment of the present invention. It is emphasized that the present invention, as claimed, could be implemented utilizing a number of materials, temperature ranges, and construction techniques. This section provides an indication of a few specified materials which may be utilized by one following the basic concept of the present invention.

Each dielectric layer is typically formed to be at least 3000 Å thick. If the dielectric layer is more than this dimension, plus the thickness of the dielectric layer which would be removed by the above described planarization processes, then the planarization processes may be utilized without applying the sacrificial layer 40. However, if the dielectric layer has a thickness which is very close to the minimum permitted to provide proper operation of the semiconductor chip (or to remain within applicable electronic requirements), then the sacrificial layer becomes necessary to provide proper rework or reclamation of the specific layer of the semiconductor chip.

The material for the sacrificial layer may be selected from a large variety of materials. More specifically, the sacrificial layer may be formed from an organic or an inorganic layer, including, but not being limited to, chemical vapor deposited oxides, silicon, photoresist, polyimide, etc. If the sacrificial layer is organic, then the dielectric layer should be organic; if the sacrificial layer is inorganic, then the sacrificial layer should be inorganic. If one of the dielectric and sacrificial layers is inorganic and the other is organic, then the sacrificial layer should be completely removed by the above-described combination of the acid and base planarization processes, and if it is not removed, then further steps should be undertaken to remove the remnants of the sacrificial layer. If there are remnants of the sacrificial layer left behind prior to deposition of another dielectric layer on top of the present dielectric layer; and the classification of the sacrificial layer as organic or inorganic does not match that of the dielectric layer, then a resultant bond between the dielectric layer and the sacrificial layer will be relatively weak. This relatively weak bond may permit delamination between the layers. The exemplary embodiment sacrificial insulator layer, being approximately 3000 Å thick, represents the thickness of material which may be removed during approximately four minutes of the acid planarization process and approximately four minutes of the base planarization process. Of course, the amount of time required for the planarization processes vary depending upon the type of material used in the sacrificial layer.

The connecting stud 24 likewise may be formed from a wide variety of materials, but it is necessary that the connecting stud have adequate electrical conductivity characteristics. It is preferred that a tungsten alloy be used. The tungsten may be formed using chemical vapor deposition processes as are well known in the art.

The metallic layer 20 may be formed from a wide variety of material. It is necessary that the metallic layer be able to conduct electrical currents adequately. The metallic layer is formed from an aluminum alloy in the preferred embodiments. More particularly, aluminum alloys in which aluminum comprises 85 percent of the mass of the above alloys such as aluminum copper, aluminum silicon, or aluminum copper silicon have been found especially applicable. One advantage of using the above sacrificial layer when a metallic layer is formed from an aluminum alloy is that since aluminum is a relatively soft metal that can be easily broken off by a polishing pad surface during the acid and the base planarization processes. The aluminum alloy pieces may smear during planarization processes. This aluminum alloy smear will tend to smear over and/or imbed into the dielectric or sacrificial layers it encounters. Therefore, as the sacrificial layer is removed by the acid or base planarization processes, the smearing effects of the aluminum alloy is limited as the material which has been smeared or embedded is removed. It is difficult to remove any smearing effects of the dielectric layer itself since the amount of material which can be removed from the dielectric layer is limited. A wide variety of acid and base planarization processes may be utilized in the present invention depending upon the materials used in the metallic layer, dielectric material and connecting stud material. However, utilizing the above described materials, the following slurries may be used:

Acid Slurry: Combine by weight 7.35% $Fe(NO_3)_3$, 0.735% $Al_2O_3$, and the remainder water into a slurry. The temperature, pressure and polishing pad speed and pad type can be modified to alter removal rates.

Base Slurry: Combine 2 parts by weight commercially available Cabosperse-SC1, produced by Cabot Industries (both Cabosperse and Cabot Industries are trademarks) with 1 part water. Another suitable base slurry may be utilized as well. The temperature, pressure, and polishing pad speed and pad type can be modified to alter the removal rates.

While the invention has been particularly shown and described with respect to a preferred embodiment thereof, it will be understood by those skilled in the art that changes in form and details may be made therein without departing from the scope and spirit of the invention.

What is claimed is:

1. A method for removing conductive metals on a semiconductor chip, while leaving a foundation substantially intact, on which the conductive metal is in contact with the foundation including a dielectric layer and a connecting stud, the method includes the steps of:
   applying a first reactive planarization process to said semiconductor chip, the first planarization process being selected to attack the conductive metal at a high rate; discontinuing the first planarization process prior to when the connecting stud via is exposed to direct effects of the first planarization process; and
   applying a second reactive planarization process to said semiconductor chip to remove any remaining conductive metal, the second planarization process being selected to attack the conductive metal at a relatively high rate, while attacking the connecting stud at a low rate.

2. The method as described in claim 1, wherein said first planarization process step utilizes a chemical-mechanical polishing technique.

3. The method as described in claim 1, wherein said first planarization process step utilizes a plasma etch technique.

4. The method as described in claim 1, wherein said first planarization process step utilizes a wet etch technique.

5. The method as described in claim 1, further comprising an initial step of:
   depositing a sacrificial material over the semiconductor chip, the sacrificial material being selected to have a rate equal to, or higher than, the removal rate of the dielectric layer.

6. The method as described in claim 5, wherein said sacrificial material is inorganic.

7. The method as described in claim 5, wherein said sacrificial material is a glass.

8. The method as described in claim 5, wherein said sacrificial material is organic.

9. The method as described in claim 8, wherein said sacrificial material is a photoresist.

10. The method as described in claim 8, wherein said sacrificial material is a polyimide.

11. The method as described in claim 5, wherein the sacrificial material is selected to not be attacked at a rapid rate during the first planarization process, and to be attacked at a rapid rate during the second planarization process.

12. The method as described in claim 1, wherein said first planarization process step is acid.

13. The method as described in claim 1, wherein said second planarization process step is basic.

14. The method as described in claim 1, wherein said second planarization process step utilizes a chemical-mechanical polishing technique.

15. The method as described in claim 1, wherein said second planarization process step utilizes a plasma etch technique.

16. The method as described in claim 1, wherein said second planarization process step utilizes a wet etch technique.

17. The method as described in claim 1, wherein the dielectric layer is formed from a material which has a relatively high reactivity to an attack by a base, but a relatively low reactivity to an attack by an acid.

18. A method for removing at least a portion of a metal layer from a semiconductor chip, the method comprises the steps of:
   applying a sacrificial layer to all portions of the semiconductor chip which may be exposed to a planarization process, excepting for said metal layer;
   applying a first reactive planarization process to said semiconductor chip, the first planarization process being selected to attack the conductive metal at a high rate; discontinuing the first planarization process prior to when the connecting stud via is exposed to direct effects of the first planarization process; and
   applying a second reactive planarization process to said semiconductor chip to remove any remaining conductive metal, the second planarization process being selected to attack the conductive metal at a relatively high rate, while attacking the connecting stud at a low rate.

19. The method as described in claim 18, wherein said applying said planarization process step also at least partially removes said sacrificial layer.

20. The method as described in claim 18, wherein said applying said planarization process step removes substantially all of said sacrificial layer.

21. The method as described in claim 18, wherein said semiconductor chip is at least partially formed from a dielectric layer, the method further comprising the step of:
   depositing a sacrificial material over the semiconductor chip, the sacrificial material has a removal rate equal to, or higher than, the removal rate of the dielectric layer.

* * * * *